(12) United States Patent
Song et al.

(10) Patent No.: US 7,480,882 B1
(45) Date of Patent: Jan. 20, 2009

(54) MEASURING AND PREDICTING VLSI CHIP RELIABILITY AND FAILURE

(75) Inventors: Peilin Song, Lagrangeville, NY (US); David Heidel, Mahopac, NY (US); Franco Motika, Hopewell Junction, NY (US); Franco Stellari, Waldwick, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/049,344

(22) Filed: Mar. 16, 2008

(51) Int. Cl.
*G06F 17/50* (2006.01)
*G06F 19/00* (2006.01)
*G06F 11/27* (2006.01)
*G01R 31/3187* (2006.01)
*G01R 31/28* (2006.01)

(52) U.S. Cl. .................. 716/6; 703/16; 702/59; 702/79; 702/125; 714/30; 714/32; 714/41; 714/700; 714/732; 714/733; 714/734

(58) Field of Classification Search .......... 716/6; 703/16; 714/30, 32, 41, 700, 732, 733, 734; 702/59, 79, 125
See application file for complete search history.

(56) References Cited

U.S. PATENT DOCUMENTS

| | | | |
|---|---|---|---|
| 4,635,256 A * | 1/1987 | Herlein .................. 714/700 |
| 5,592,493 A * | 1/1997 | Crouch et al. ............ 714/729 |
| 5,903,466 A * | 5/1999 | Beausang et al. ......... 716/18 |
| 5,923,676 A * | 7/1999 | Sunter et al. ............ 714/733 |
| 6,021,514 A | 2/2000 | Koprowski |
| 6,052,811 A * | 4/2000 | Ahsuri ................... 714/745 |
| 6,083,273 A * | 7/2000 | Takeuchi ................. 716/6 |
| 6,148,425 A * | 11/2000 | Bhawmik et al. ......... 714/726 |
| 6,178,534 B1 | 1/2001 | Day et al. |
| 6,256,759 B1 * | 7/2001 | Bhawmik et al. ......... 714/726 |
| 6,272,668 B1 * | 8/2001 | Teene .................... 716/10 |
| 6,327,686 B1 * | 12/2001 | Grundmann et al. ...... 714/738 |
| 6,427,226 B1 * | 7/2002 | Mallick et al. ........... 716/10 |
| 6,442,723 B1 | 8/2002 | Koprowski et al. |
| 6,671,838 B1 | 12/2003 | Koprowski et al. |
| 6,807,645 B2 | 10/2004 | Angelotti et al. |
| 6,829,573 B1 * | 12/2004 | Matsumoto et al. ....... 703/20 |
| 6,999,900 B2 * | 2/2006 | McLaurin et al. ......... 702/183 |
| 7,017,094 B2 * | 3/2006 | Correale et al. .......... 714/733 |
| 7,058,867 B2 * | 6/2006 | Suzumura ................. 714/726 |

(Continued)

OTHER PUBLICATIONS

"New approach moves logic BIST into mainstream", By R. Kapur, R. Chandramouli and T.W. Williams, EE Times and EEdesign, Oct. 14, 2002 (5:56 p.m. EST).

*Primary Examiner*—Phallaka Kik
(74) *Attorney, Agent, or Firm*—MaxValueIP, LLC

(57) ABSTRACT

This embodiment replaces the use of LBIST to get a pass or no-pass result. A selective signature feature is used to collect the top failing paths, by shmooing the chip over a cycle time. These paths can be stored on-chip or off-chip, for later use. Once the chip is running in the field for a certain time, the same procedure is performed to collect the top failing paths, and this is compared with the stored old paths. If the order of the top paths changes, it indicates that (for example) there is a path (not the slowest path before) that slows more than others, which could be potential reliability concern. Therefore, a potential reliability failure is identified in the field.

1 Claim, 5 Drawing Sheets

U.S. PATENT DOCUMENTS

| | | | |
|---|---|---|---|
| 7,120,890 B2* | 10/2006 | Urata et al. | 716/12 |
| 7,269,805 B1* | 9/2007 | Ansari et al. | 716/4 |
| 7,290,183 B2* | 10/2007 | Shimamura | 714/700 |
| 7,318,003 B2* | 1/2008 | Sotiriou | 702/125 |
| 2004/0103355 A1* | 5/2004 | Correale et al. | 714/733 |
| 2004/0187057 A1* | 9/2004 | Suzumura | 714/726 |
| 2005/0010886 A1* | 1/2005 | Urata et al. | 716/6 |
| 2005/0055611 A1* | 3/2005 | Shimamura | 714/700 |
| 2005/0188230 A1* | 8/2005 | Bilak | 713/300 |
| 2005/0235177 A1* | 10/2005 | Ohara et al. | 714/700 |
| 2006/0031728 A1* | 2/2006 | Warren et al. | 714/724 |
| 2006/0156050 A1* | 7/2006 | Sotiriou | 713/500 |
| 2007/0234266 A1* | 10/2007 | Chen et al. | 716/13 |
| 2008/0010575 A1* | 1/2008 | Yamaguchi | 714/734 |

* cited by examiner

MEASURING AND PREDICTING VLSI CHIP RELIABILITY AND FAILURE

BACKGROUND OF THE INVENTION

Reliability becomes a big concern for modern VLSI chips, due to the shrinking lithography, new material, and design complexity, etc. The major causes of reliability failures include electro-migration (modeled as resistive bridges), gate oxide breakdown (resistive shorts), hot carrier injection (delay faults), etc. Most of the reliability failures will cause the chip to degrade or slow down, and eventually the chip will stop functioning. Therefore, there is a need to monitor and predict the reliability of a chip in the field. So far, there is no on-line reliability monitor once the chip is shipped. Therefore, the degradation of a chip cannot be monitored. This embodiment teaches a new solution for this problem.

SUMMARY OF THE INVENTION

Logic-Built-In-Self-Test (LBIST) is a widely accepted Design-for-Test (DFT) feature of VLSI chip designs, especially for the microprocessor designs. It can be used to test the circuit at wafer, chip, and system level. During testing, a specific designed circuitry is running and generates test stimulus and collects testing results. Test can be performed at both dc and ac fashion.

With added features and new methodology, LBIST can be used as an on-line reliability monitor with very little or no overhead, depending on the LBIST implementation.

In an embodiment of this invention, instead of using LBIST to get a pass or no-pass result, a selective signature feature is used to collect the top failing paths by shmooing the chip over a cycle time. These paths can be stored on-chip or off-chip for later use. Once the chip is running in the field for a certain time, the same procedure is performed to collect the top failing paths and compared with the stored old paths, if the order of the top paths changes, it indicates that for example there is a path (not the slowest path before) that slows more than others, which could be potential reliability concern. Therefore, a potential reliability failure is identified in the field.

DETAILED DESCRIPTION OF THE PREFERRED EMBODIMENTS

Figure 1:
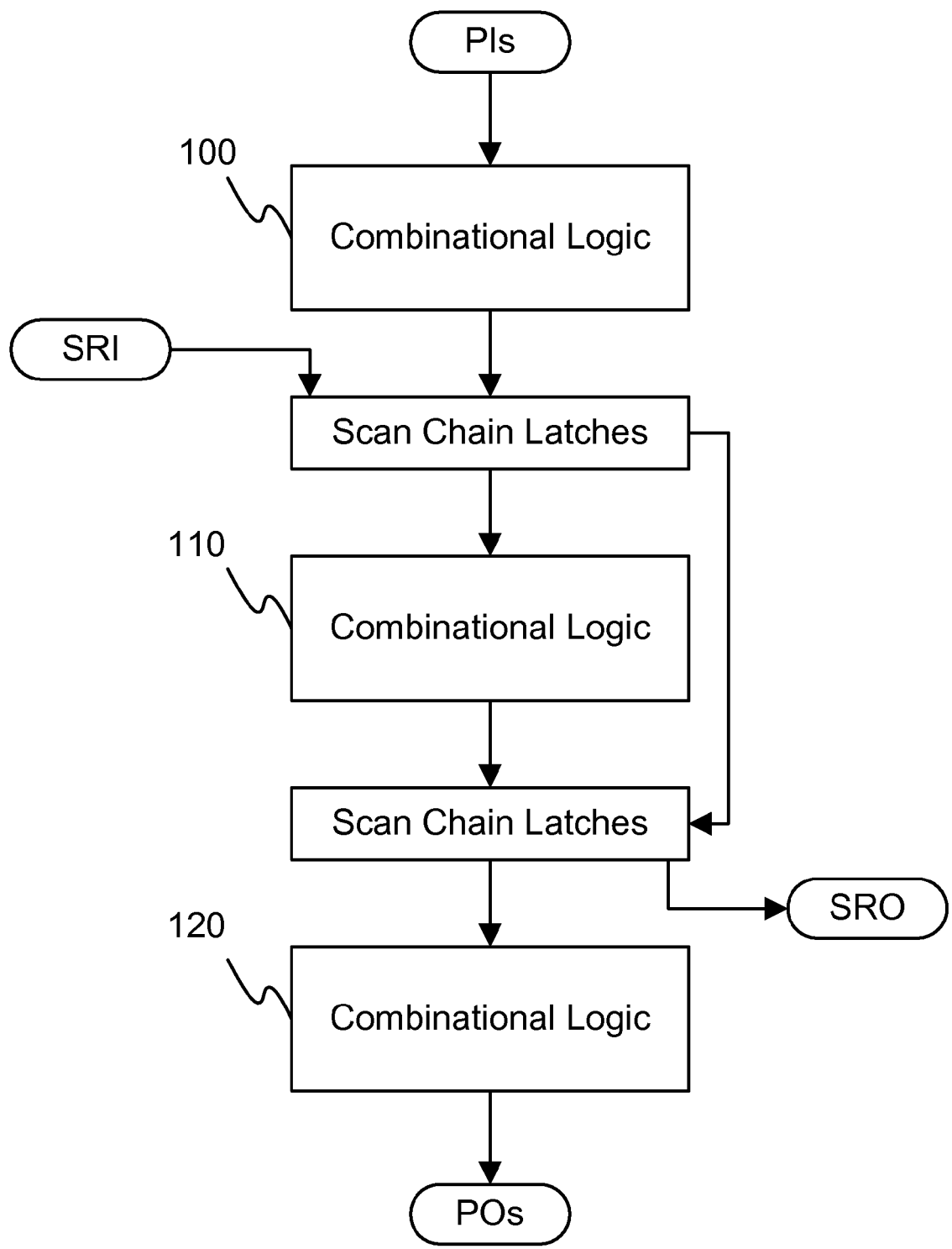
FIG. 1 is a schematic diagram of a typical LSSD configuration.

The LSSD (level sensitive scan design) methodology is a system design and a Design-for-Test (DFT) approach that incorporates several basic test concepts, i.e. scan design. In such a design, most of the device's storage elements, such as latches or registers, are concatenated in one or more scan chains and can be externally accessible via one or more serial inputs and outputs. Storage elements that are not in this category are usually memory or other special macros that are isolated and tested independently. Furthermore, this design methodology ensures that all logic feedback paths are gated by one or more of these storage elements, thereby simplifying a sequential design into subsets of combinational logic (100, 110 and 120, respectively) sections as shown in FIG. 1.

Figure 2:
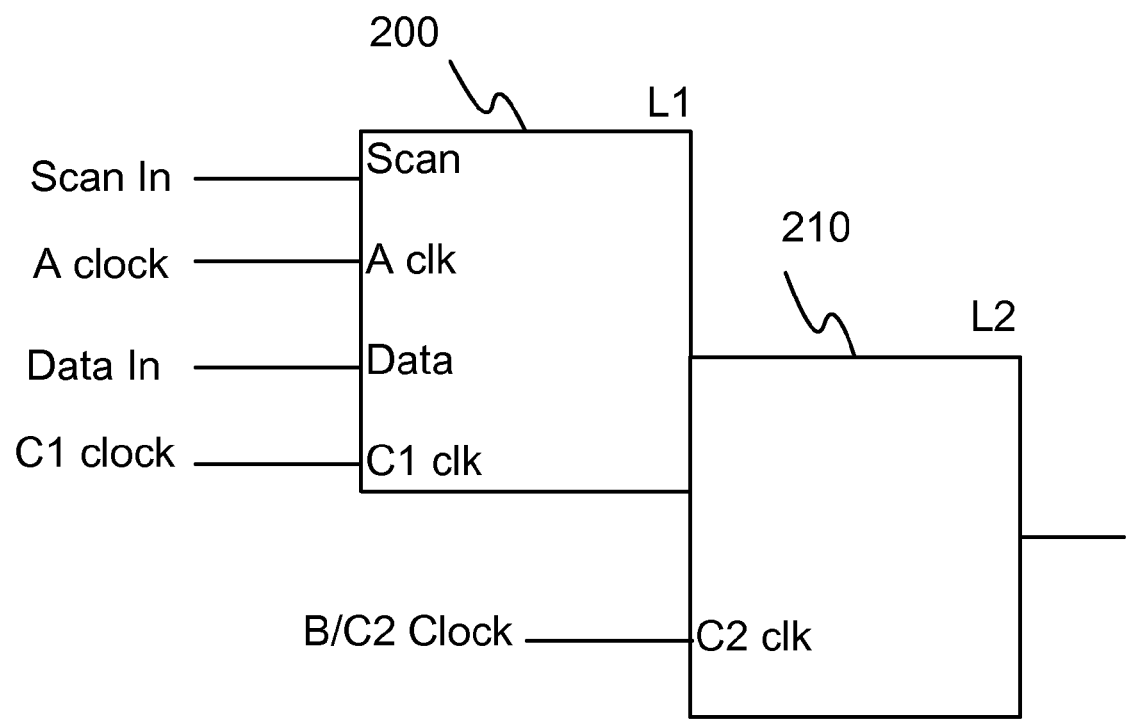
FIG. 2 is a schematic diagram of a typical L1/L2 latch.

These basic design concepts in conjunction with the associated system and scan clocking sequences greatly simply the test generation, testing, and diagnose-ability of very complex logic structures. Every latch can be used as a pseudo Primary Input (PI) and as a pseudo Primary Output (PO) in addition to the standard PIs and POs to enhance the stimulation and observe-ability of the device being tested or diagnosed. LSSD latches are typically implemented in a L1/L2 configuration where the L1 or master latch has two data ports and may be updated either using scan clock A/B or functional clock C1/C2 (200 and 210, respectively) as shown in FIG. 2. The L2 or slave latch has only one clock input and that clock is out of phase with both L1 clocks. Scanning is done using separate A and B clocks.

Figure 3:
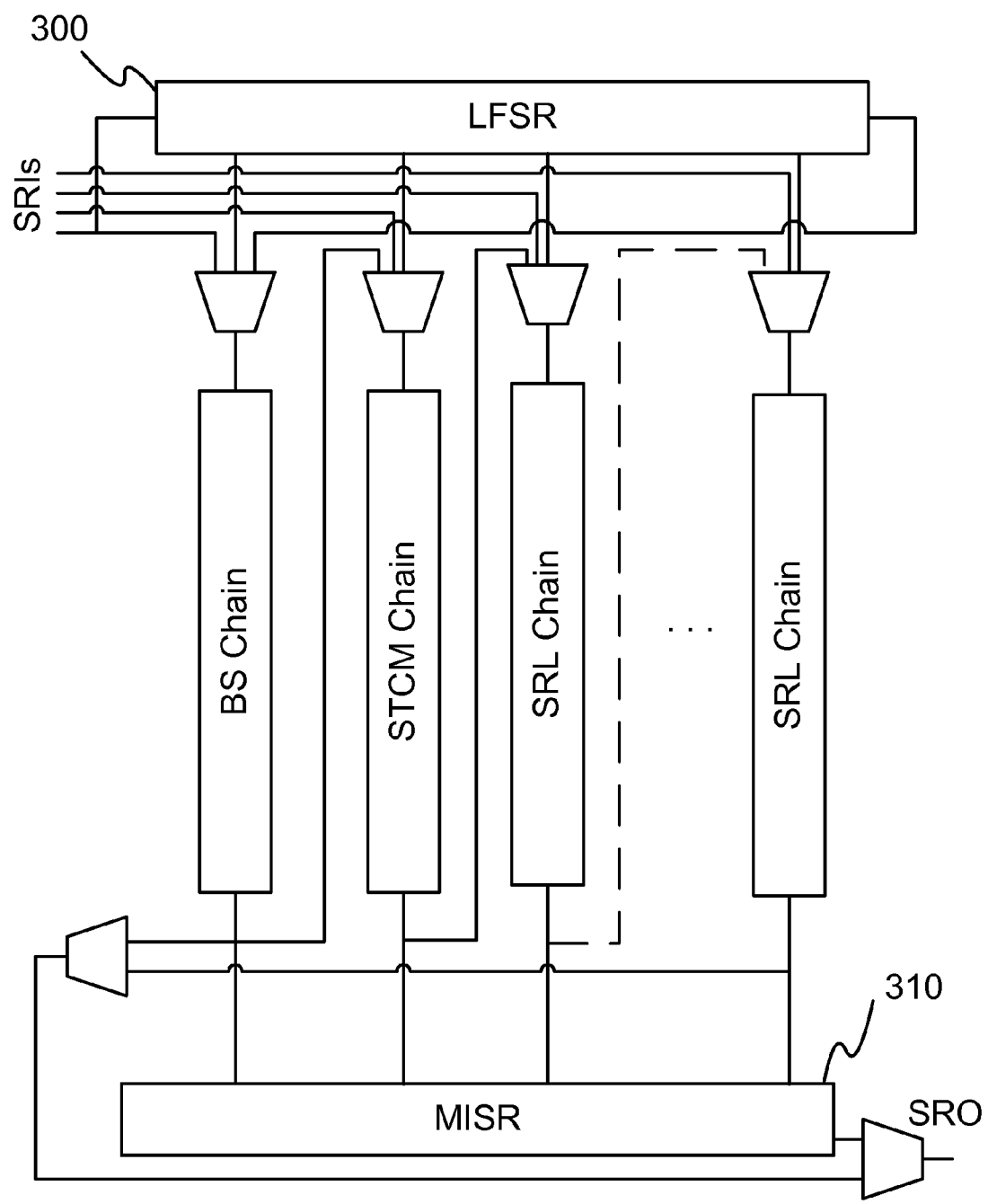
FIG. 3 is a schematic diagram of Stumps LBIST configuration.

In a typical STUMPS structure, shown in FIG. 3, LFSR (300) is used to generate the pseudo random patterns. These patterns are scanned in through L1/L2 latches via A/B clocks. Then, the system clocks C1/C2 are used to insert these patterns into the combination logic and A/B clocks are used to scan the test responses to the MISR (310). A certain number of responses can be compressed into a MISR signature. This signature can be compared with a simulation signature and the result will show if the chip is good or bad. Repeat this procedure until all the test patterns are applied, thereafter, the whole chip is tested.

Figure 4:
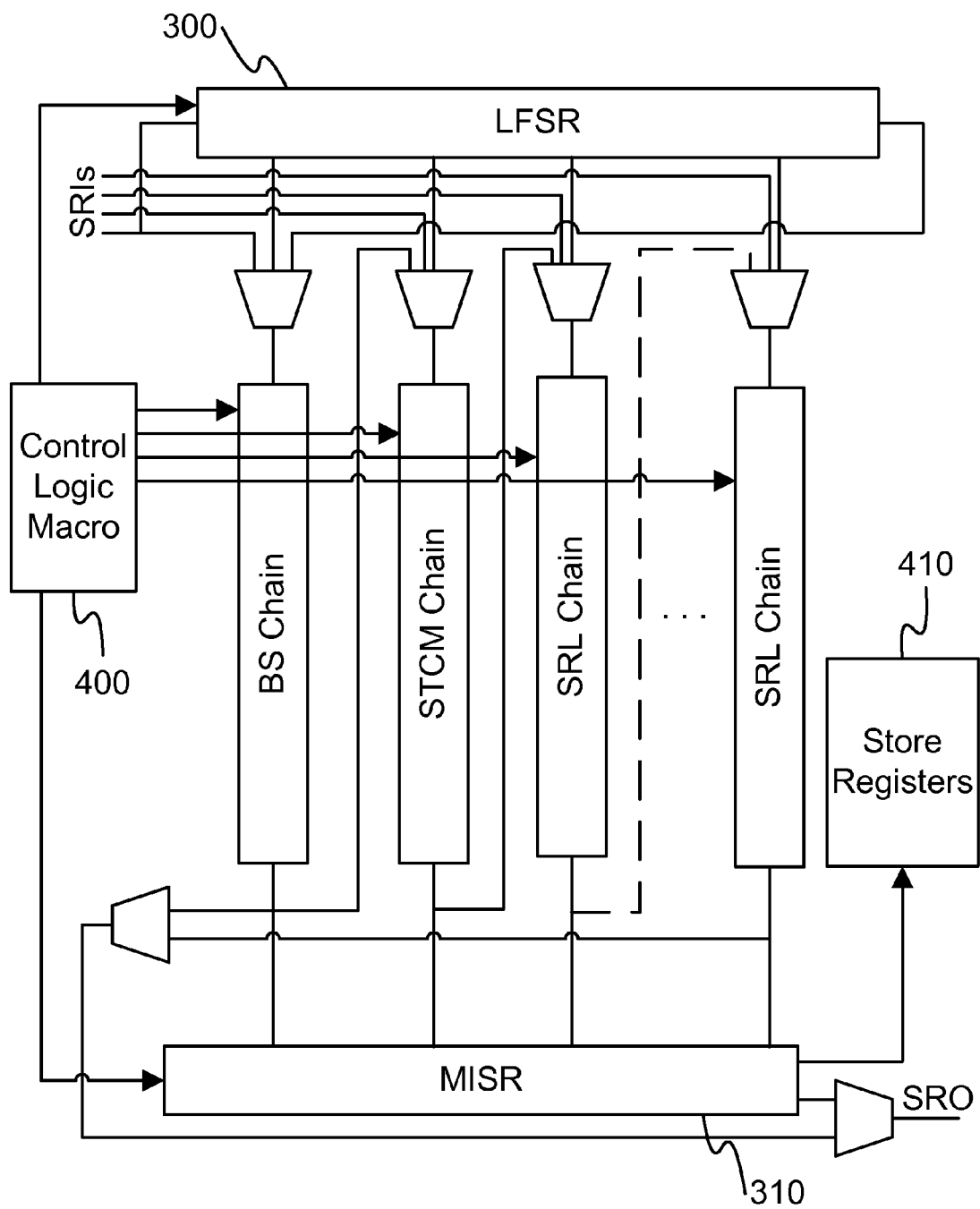
FIG. 4 is a schematic diagram of Selective signature LBIST scheme.

This STUMPS structure can be further enhanced by adding some control logic (400) to not only let the test results from a group of latches compress into MISR, but an individual latch as well. FIG. 4 shows such structure. This feature is called selective signature.

Figure 5:
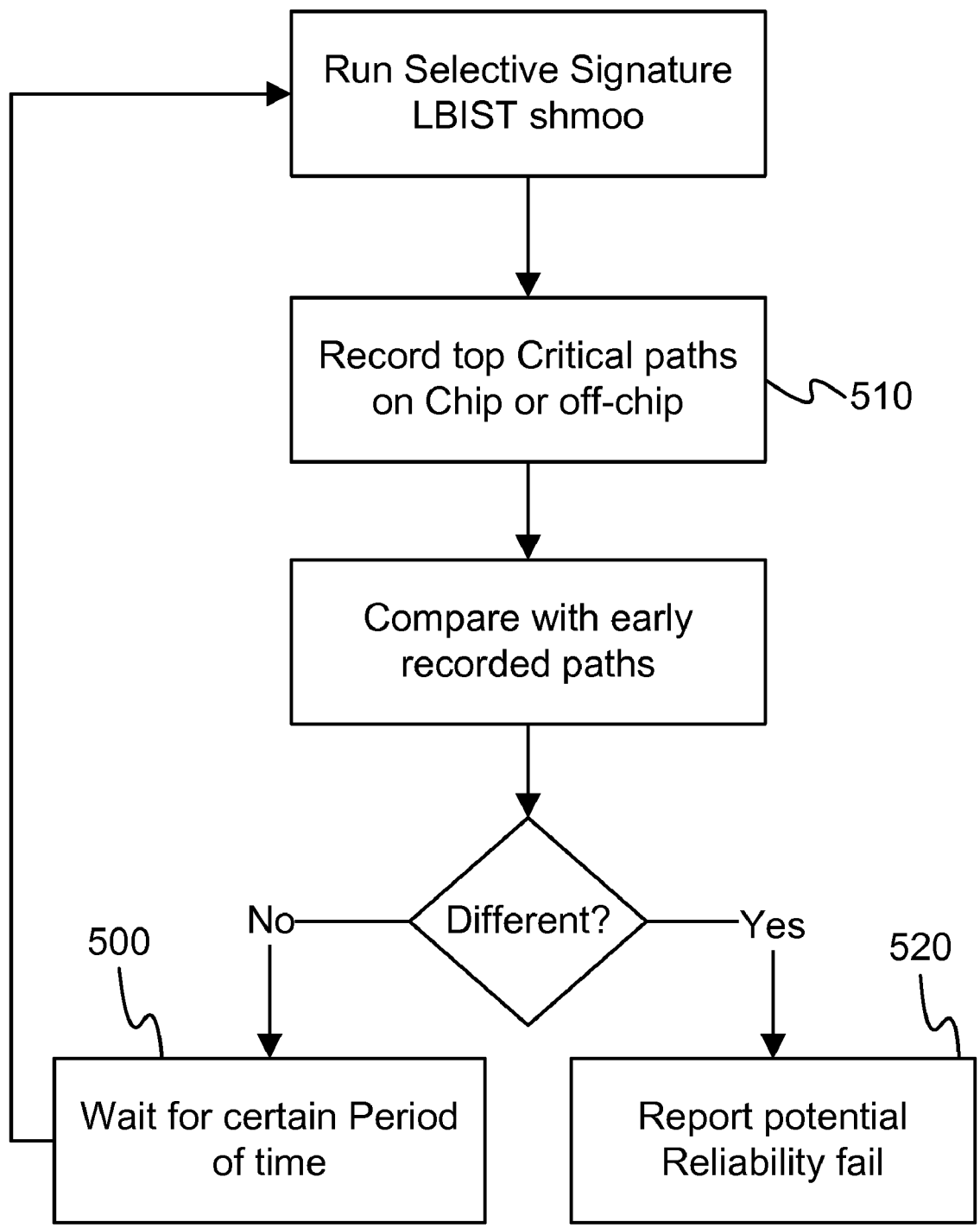
FIG. 5 is a flow diagram of Reliability monitor scheme.

In an embodiment of this invention, with the structure shown in FIG. 4, every single path on a chip can be tested by only selecting one latch at a time to compress into MISR while shmooing the chip. Once all the results from every latch are recorded, the top critical paths are determined. A critical path (or called critical timing path) is a logical path that runs slower than predicted or slower than any other logical paths in the system. These top critical paths can be stored on chip (410) as well as off-chip for later comparison. FIG. 5 shows the on-chip and off-chip storage scheme. In the on-chip case, a group of registers is added to store the latches. In the off-chip case, latches can be recorded in any storage medium, such as electronic file, tape, and CD. After a certain period of time (500), the above procedure is repeated and the top critical paths are recorded (510). If there is a reliability problem, the order of top critical paths or the timing of top paths will be changed, which will indicate a potential reliability problem (520).

An embodiment of the invention is a method for measuring and predicting reliability of a VLSI chip, the method is comprised of:

Running a plurality of selective signature shmoo tests on the VLSI chip to determine a first plurality of top critical paths based on a first selective signature shmoo test of the plurality of selective signature shmoo tests; moreover there are a predetermined number of critical paths in the first plurality of top critical paths which results in ordering a first critical path in the first plurality of top critical paths based on a first timing of the first critical path that assigns a first critical path order to the first critical path and storage of the first plurality of top critical paths.

If the storing step is done off-chip, the first plurality of top critical paths is recorded in a storage media. If the storing step is done on-chip, the plurality of top critical paths is recorded in one or more critical path registers on the VLSI chip and to determine a second plurality of top critical paths based on a second selective signature shmoo test of the plurality of selective signature shmoo tests; wherein the second selective signature shmoo test is performed in a field after a cycle time proceeding the first selective signature shmoo test and to order each second critical path in the second plurality of top critical paths based on a second timing of the second critical path and assigning a second critical path order to the second critical path. Moreover to compare the second plurality of top critical paths with the first plurality of top critical paths.

If in the comparison step, the second critical path order is the same as the first critical path order, and the second critical path is not the same as the first critical path, then reporting a change in critical path order of the first critical path and a potential reliability issue.

If in the comparing step, the second critical path order is the same as the first critical path order, the second critical path is the same as the first critical path, and the first timing is more than the second timing by more than a time degradation threshold value, then reporting an increase in timing of the first critical path and a potential reliability issue. The plurality of selective signature shmoo tests are performed using a level sensitive scan design and testing methodology; wherein the VLSI chip has a logic-built-in-self-test feature; and the logic-built-in-self-test feature comprises one or more latches and one or more registers, concatenated in one or more scan chains, accessible via one or more serial inputs and one or more serial outputs, a linear feedback shift register generating one or more pseudo-random patterns, a control logic to select a set of the one or more latches and test results from the set of the one or more latches associated with a selective signature for collection into a multiple-input-signature register, and the multiple-input-signature register.

A system, apparatus, or device comprising one of the following items is an example of the invention: VLSI, chip, reliability analyzer, failure analyzer, tests, storing, registers, Shmoo test, computer monitor, or any display device, applying the method mentioned above, for purpose of VLSI/chip analysis, reliability, and management.

Any variations of the above teaching are also intended to be covered by this patent application.

The invention claimed is:

1. A method for measuring and predicting reliability of a VLSI chip, said method comprising:
    running a plurality of selective signature shmoo tests on said VLSI chip;
    determining a first plurality of top critical paths based on a first selective signature shmoo test of said plurality of selective signature shmoo tests;
    wherein there are a predetermined number of critical paths in said first plurality of top critical paths;
    ordering a first critical path in said first plurality of top critical paths based on a first timing of said first critical path and assigning a first critical path order to said first critical path;
    storing said first plurality of top critical paths;
    wherein if said storing step is done off-chip, said first plurality of top critical paths are recorded in a storage media;
    wherein if said storing step is done on-chip, said plurality of top critical paths are recorded in one or more critical path registers on said VLSI chip;
    determining a second plurality of top critical paths based on a second selective signature shmoo test of said plurality of selective signature shmoo tests;
    wherein said second selective signature shmoo test is performed in a field after a cycle time proceeding said first selective signature shmoo test;
    ordering each second critical path in said second plurality of top critical paths based on a second timing of said second critical path and assigning a second critical path order to said second critical path;
    comparing said second plurality of top critical paths with said first plurality of top critical paths;
    if in said comparing step, said second critical path order is the same as said first critical path order, and said second critical path is not the same as said first critical path, then reporting a change in critical path order of said first critical path and a potential reliability issue;
    if in said comparing step, said second critical path order is the same as said first critical path order, said second critical path is the same as said first critical path, and said first timing is more than said second timing by more than a time degradation threshold value, then reporting an increase in timing of said first critical path and a potential reliability issue;
    wherein said plurality of selective signature shmoo tests are performed using a level sensitive scan design and testing methodology;
    wherein said VLSI chip has a logic-built-in-self-test feature; and
    wherein said logic-built-in-self-test feature comprises one or more latches and one or more registers, concatenated in one or more scan chains, accessible via one or more serial inputs and one or more serial outputs, a linear feedback shift register generating one or more pseudo-random patterns, a control logic to select a set of said one or more latches and test results from said set of said one or more latches associated with a selective signature for collection into a multiple-input-signature register, and said multiple-input-signature register.

* * * * *